(12) United States Patent
Yoshida

(10) Patent No.: US 7,932,624 B2
(45) Date of Patent: Apr. 26, 2011

(54) SEMICONDUCTOR MODULE, AND HYBRID VEHICLE DRIVE DEVICE INCLUDING THE SAME

(75) Inventor: Tadafumi Yoshida, Nisshin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 304 days.

(21) Appl. No.: 12/223,606

(22) PCT Filed: Feb. 14, 2007

(86) PCT No.: PCT/JP2007/053130
§ 371 (c)(1),
(2), (4) Date: Aug. 5, 2008

(87) PCT Pub. No.: WO2007/094508
PCT Pub. Date: Aug. 23, 2007

(65) Prior Publication Data
US 2009/0015185 A1   Jan. 15, 2009

(30) Foreign Application Priority Data
Feb. 17, 2006 (JP) ................................. 2006-041145

(51) Int. Cl.
*B60L 1/00* (2006.01)
*H02G 3/00* (2006.01)
*B60K 6/20* (2007.10)
*B60W 20/00* (2006.01)

(52) U.S. Cl. .................... 307/9.1; 180/65.21; 180/65.22; 180/65.265

(58) Field of Classification Search .................... 307/9.1; 180/65.21, 65.22, 65.265
See application file for complete search history.

(56) References Cited

U.S. PATENT DOCUMENTS
5,965,921 A * 10/1999 Kojima ........................ 257/369
6,884,953 B2    4/2005 Nii et al.
(Continued)

FOREIGN PATENT DOCUMENTS
DE          100 49 723 A1    4/2002
(Continued)

OTHER PUBLICATIONS

Translation of Japanese Patent No. JP2002-217364A (Naruse, Mikio), obtained Aug. 10, 2010.*

*Primary Examiner* — Hal I Kaplan
(74) *Attorney, Agent, or Firm* — Kenyon & Kenyon LLP

(57) ABSTRACT

A bus bar constitutes a power line and another bus bar constitutes an earth line. The bus bars are layered in the normal direction of an insulating substrate via an insulating member. Here, the bus bar positioned at the upper side is formed by a metal member and the bus bar positioned at the lower side is formed by a wiring layer formed on the insulating substrate. Since one of the bus bars is the wiring layer fixed to the insulating substrate, it is possible to assure heat radiation of the bus bar. Thus, it is possible to make the bus bar a wiring layer having a comparatively small cross sectional area and reduce the semiconductor module size in the normal direction. By mounting the semiconductor module on the drive device for a hybrid vehicle, it is possible to reduce the vertical-direction size when mounted on the vehicle and lower the position of the center of gravity of the vehicle to improve the running stability.

14 Claims, 11 Drawing Sheets

U.S. PATENT DOCUMENTS 7,298,027 B2 * 11/2007 Yea et al. .................. 257/666
2003/0226685 A1 12/2003 Murakami

FOREIGN PATENT DOCUMENTS

| | | |
|---|---|---|
| DE | 10 2004 019 108 A1 | 12/2004 |
| JP | 11-187542 A | 7/1999 |
| JP | 11-299056 A | 10/1999 |
| JP | 2001-332688 A | 11/2001 |
| JP | 2002-217364 A | 8/2002 |
| JP | 2003-009507 A | 1/2003 |
| JP | 2003-197858 A | 7/2003 |
| JP | 2004-14862 A | 1/2004 |
| JP | 2005-033882 A | 2/2005 |

* cited by examiner

SEMICONDUCTOR MODULE, AND HYBRID VEHICLE DRIVE DEVICE INCLUDING THE SAME

This is a 371 national phase application of PCT/JP2007/053130 filed 14 Feb. 2007, claiming priority to Japanese Patent Application No. 2006-041145 filed 17 Feb. 2006, the contents of which are incorporated herein by reference.

TECHNICAL FIELD

The present invention relates to a semiconductor module, and a hybrid vehicle drive device including the semiconductor module. More particularly, the present invention relates to a semiconductor module formed by an inverter and a converter, and a hybrid vehicle drive device including the semiconductor module.

BACKGROUND ART

Recently, a hybrid vehicle and an electric vehicle have received attention as a vehicle giving consideration to environment. The hybrid vehicle adopts, as a source of mechanical power, a motor driven by a DC power supply through an inverter, in addition to an engine that has been conventionally used as such a source of mechanical power. In the hybrid vehicle, more specifically, the engine is driven to obtain mechanical power. Further, the inverter converts a DC voltage generated by the DC power supply to an AC voltage, and the motor is rotated by the converted AC voltage to obtain mechanical power. On the other hand, the electric vehicle adopts, as a source of mechanical power, a motor driven by a DC power supply through an inverter.

An intelligent power module (IPM) to be installed on the hybrid vehicle or the electric vehicle switches a semiconductor switching element (a power semiconductor element) such as an IGBT (Insulated Gate Bipolar Transistor) at high speed, thereby converting DC power supplied from the DC power supply to AC power; thus, the motor is driven (refer to, for example, Japanese Patent Laying-Open No. 2003-9507, Japanese Patent Laying-Open No. 2005-33882, Japanese Patent Laying-Open No. 11-299056 and Japanese Patent Laying-Open No. 11-187542).

For example, Japanese Patent Laying-Open No. 2003-9507 discloses a switching circuit that includes a bus bar serving as a conductor for connecting a switching element to a power supply or a load. In such a switching circuit, different types of bus bars are fixed onto a base while being fastened to each other with an insulator being interposed therebetween.

Herein, each bus bar to be used herein is a metal member serving as a conductor having a wide sectional area which is sufficient to flow a current between the power supply or the load and the switching circuit. Then, the power supply positive electrode side bus bar connected to a positive electrode of the power supply and the power supply negative electrode side bus bar connected to a negative electrode of the power supply are fixed onto the base while being integrally fastened to each other with the insulator being interposed therebetween.

In the switching circuit described above, however, the bus bars each of which is a metal member are arranged while overlapping with each other in a normal direction of the base with the insulator being interposed therebetween. Consequently, there arises a problem that the switching circuit increases in size in the normal direction of the base. This problem hinders miniaturization of the switching circuit in the normal direction although miniaturization of the IPM is demanded strongly.

Moreover, Japanese Patent Laying-Open No. 2003-9507 discloses a connection relation between a switching element and a power supply side bus bar and a connection relation between a switching element and a load side bus bar (a U-phase side bus bar, a V-phase side bus bar, a W-phase side bus bar), but does not disclose an arrangement of an outlet for a signal line through which each switching element receives a signal for controls a switching operation. In order to miniaturize the IPM, therefore, sufficient consideration must be given to the arrangement of the outlet for the signal line.

The present invention has been devised to solve the problems described above, and an object thereof is to provide a semiconductor module capable of achieving miniaturization, and a hybrid vehicle drive device including the semiconductor module.

DISCLOSURE OF THE INVENTION

According to the present invention, a semiconductor module includes a first power supply line, a second power supply line, first and second switching elements, and an insulating substrate. The first power supply line is connected to a first electrode of a power supply. The second power supply line is connected to a second electrode of the power supply. The first and second switching elements are connected between the first power supply line and the second power supply line. The insulating substrate has the first and second switching elements mounted thereon. Herein, the first power supply line includes a bus bar coupled to a first electrode layer of the first switching element, and the second power supply line includes a wiring layer disposed on the insulating substrate and coupled to a second electrode layer of the second switching element.

In the semiconductor module, one of the first and second power supply lines, that have been bus bars each made of a metal material heretofore, is mounted as a wiring layer on the insulating substrate. This configuration ensures a heat radiation path extending from the wiring layer to the insulating substrate. As a result, the wiring layer can be made thin, so that the semiconductor module can be miniaturized in a direction perpendicular to the substrate.

Preferably, the semiconductor module further includes a signal line layer, a first conductor member and a second conductor member. The signal line layer is disposed on the insulating substrate to transmit a control signal to control electrodes of the first and second switching elements. The first conductor member brings the first power supply line, the first and second switching elements and the second power supply line into electrical conduction. The second conductor member brings the control electrodes of the first and second switching elements and the signal line layer into electrical conduction. Herein, the signal line layer is disposed such that an extending direction of the first conductor member is substantially perpendicular to an extending direction of the second conductor member.

In the semiconductor module, the first electrode layer of the first switching element and the second electrode layer of the second switching element, that have been disposed with a signal line layer being interposed therebetween heretofore, can be disposed so as to adjoin to each other. This configuration allows reduction of an inductance to be distributed to the electrode layer, leading to a drop of an induced voltage (a flyback voltage) generated in a switching operation. As a result, the switching element can be formed by a small-sized element with a lower withstand voltage. Thus, this configuration allows further miniaturization and cost reduction concerning the semiconductor module.

Preferably, the first electrode layer and the second electrode layer are disposed such that a direction of a current passing through the first switching element is opposite to a direction of a current passing through the second switching element.

In the semiconductor module, a magnetic field generated around the first electrode layer is opposite in rotating direction to a magnetic field generated around the second electrode layer. As a result, the two magnetic fields are offset. This configuration allows reduction of an inductance to be distributed to the electrode layer.

Preferably, the semiconductor module further includes a heat radiation member attached to a bottom side of the insulating substrate.

In the semiconductor module, there is formed a path for dissipating heat that propagates from the wiring layer to the heat radiation member through the insulating substrate. This configuration allows further enhancement of efficiency of cooling the wiring layer. As a result, the wiring layer can be made thinner, leading to miniaturization of the semiconductor module.

According to another aspect of the present invention, a drive device for a hybrid vehicle includes a damper, a rotating electric machine, a power transfer mechanism, a case and a power control unit. The damper is coupled with a crank shaft of an internal combustion engine. The rotating electric machine is disposed so as to have an axis of rotation aligned with an axis of rotation of the damper. The power transfer mechanism transfers, to a driving shaft, a combination of mechanical power generated by the internal combustion engine with mechanical power generated by the rotating electric machine. The case houses the damper, the rotating electric machine and the power transfer mechanism. The power control unit includes a semiconductor module and controls the rotating electric machine. Herein, the semiconductor module includes a first power supply line, a second power supply line, first and second switching elements, and an insulating substrate. The first power supply line is connected to a first electrode of a power supply. The second power supply line is connected to a second electrode of the power supply. The first and second switching elements are connected between the first power supply line and the second power supply line. The insulating substrate has the first and second switching elements mounted thereon. The first power supply line includes a bus bar coupled to a first electrode layer of the first switching element, and the second power supply line includes a wiring layer disposed on the insulating substrate and coupled to a second electrode layer of the second switching element. The power control unit is, when being projected in a direction of the axis of rotation, disposed in the case so as to fall within a horizontal dimension of a projected portion of the case, that houses the damper, the rotating electric machine and the power transfer mechanism, upon installation on the vehicle.

This configuration makes the drive device for the hybrid vehicle more compact.

Preferably, the semiconductor module further includes a signal line layer, a first conductor member and a second conductor member. The signal line layer is disposed on the insulating substrate to transmit a control signal to control electrodes of the first and second switching elements. The first conductor member brings the first power supply line, the first and second switching elements and the second power supply line into electrical conduction. The second conductor member brings the control electrodes of the first and second switching elements and the signal line layer into electrical conduction. Herein, the signal line layer is disposed such that an extending direction of the first conductor member is substantially perpendicular to an extending direction of the second conductor member.

In the drive device for the hybrid vehicle, this configuration allows further miniaturization and cost reduction concerning the semiconductor module. As a result, this configuration makes the drive device for the hybrid vehicle more compact.

Preferably, the first electrode layer and the second electrode layer are disposed such that a direction of a current passing through the first switching element is opposite to a direction of a current passing through the second switching element.

In the drive device for the hybrid vehicle, this configuration allows reduction of an inductance to be distributed to the electrode layer. As a result, this configuration allows-further miniaturization and cost reduction concerning the semiconductor module.

Preferably, the semiconductor module further includes a heat radiation member attached to a bottom side of the insulating substrate.

In the drive device for the hybrid vehicle, this configuration encourages miniaturization of the semiconductor module. As a result, this configuration makes the drive device for the hybrid vehicle more compact.

According to still another aspect of the present invention, a drive device for a hybrid vehicle includes a damper, a rotating electric machine, a power transfer mechanism, a case and a power control unit. The damper is coupled with a crank shaft of an internal combustion engine. The rotating electric machine is disposed so as to have an axis of rotation aligned with an axis of rotation of the damper. The power transfer mechanism transfers, to a driving shaft, a combination of mechanical power generated by the internal combustion engine with mechanical power generated by the rotating electric machine. The case houses the damper, the rotating electric machine and the power transfer mechanism. The power control unit includes a semiconductor module and controls the rotating electric machine. Herein, the semiconductor module includes a first power supply line, a second power supply line, first and second switching elements, and an insulating substrate. The first power supply line is connected to a first electrode of a power supply. The second power supply line is connected to a second electrode of the power supply. The first and second switching elements are connected between the first power supply line and the second power supply line. The insulating substrate has the first and second switching elements mounted thereon. The first power supply line includes a bus bar coupled to a first electrode layer of the first switching element, and the second power supply line includes a wiring layer disposed on the insulating substrate and coupled to a second electrode layer of the second switching element. The power control unit is, when being projected in a direction of the axis of rotation, disposed in the case so as to fall within a vertical dimension of a projected portion of the case, that houses the damper, the rotating electric machine and the power transfer mechanism, upon installation on the vehicle.

In the drive device for the hybrid vehicle, an inverter is integrated. This configuration realizes miniaturization of the drive device for the hybrid vehicle.

Preferably, the semiconductor module further includes a signal line layer, a first conductor member and a second conductor member. The signal line layer is disposed on the insulating substrate to transmit a control signal to control electrodes of the first and second switching elements. The first conductor member brings the first power supply line, the first and second switching elements and the second power supply line into electrical conduction. The second conductor member brings the control electrodes of the first and second switching elements and the signal line layer into electrical conduction. Herein, the signal line layer is disposed such that an extending direction of the first conductor member is substantially perpendicular to an extending direction of the second conductor member.

In the drive device for the hybrid vehicle, this configuration allows further miniaturization and cost reduction concerning the semiconductor module. As a result, this configuration makes the drive device for the hybrid vehicle more compact.

Preferably, the first electrode layer and the second electrode layer are disposed such that a direction of a current passing through the first switching element is opposite to a direction of a current passing through the second switching element.

In the drive device for the hybrid vehicle, this configuration allows reduction of an inductance to be distributed to the electrode layer. As a result, this configuration allows further miniaturization and cost reduction concerning the semiconductor module.

Preferably, the semiconductor module further includes a heat radiation member attached to a bottom side of the insulating substrate.

In the drive device for the hybrid vehicle, this configuration encourages miniaturization of the semiconductor module. As a result, this configuration makes the drive device for the hybrid vehicle more compact.

Preferably, the power control unit further includes a reactor and a capacitor. The reactor is disposed at a first side of the rotating electric machine with respect to an axis of rotation center. The capacitor is disposed at a second side of the rotating electric machine with respect to the axis of rotation center.

The drive device for the hybrid vehicle can be made low in height and small in size. Moreover, the semiconductor module makes a center of gravity of the vehicle low, and improves running stability of the vehicle.

According to the present invention, one of the first and second power supply lines each connected to the power supply is mounted as a wiring layer on the insulating substrate, leading to miniaturization of the semiconductor module in a normal direction.

Moreover, the first electrode layer of the first switching element and the second electrode layer of the second switching element adjacent to the first switching element can be disposed so as to adjoin to each other, leading to reduction of an inductance to be distributed to the electrode layer. As a result, this configuration allows miniaturization of the switching element. In addition, this configuration allows further miniaturization and cost reduction concerning the semiconductor module.

Further, the semiconductor module according to the present invention makes the drive device for the hybrid vehicle small in the vertical direction at the time when the drive device is installed on the vehicle. Moreover, the semiconductor module makes the center of gravity of the vehicle low, and improves the running stability of the vehicle.

BEST MODES FOR CARRYING OUT THE INVENTION

Figure 1:
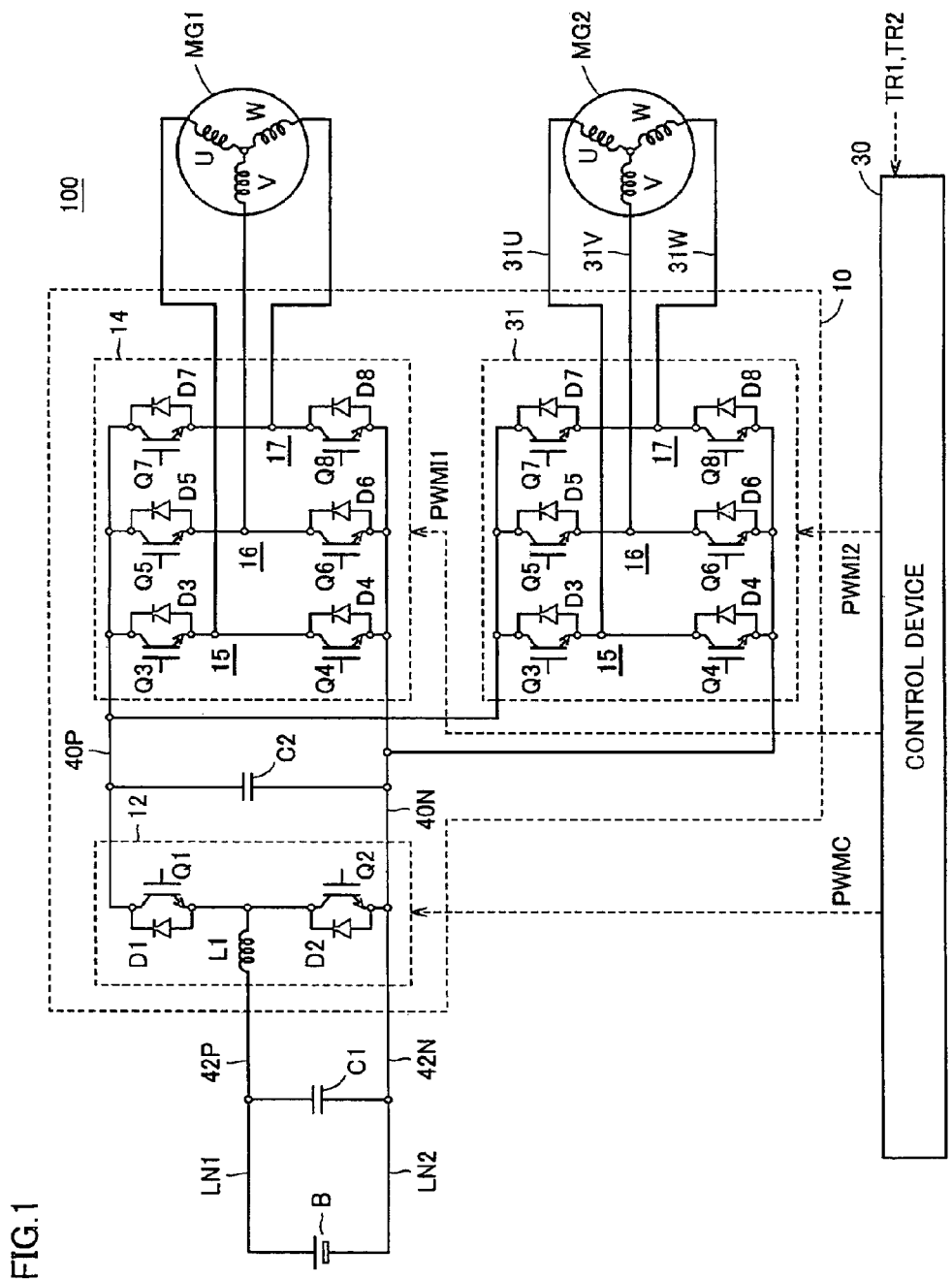
FIG. 1 is a schematic block diagram showing a motor drive device equipped with a semiconductor module according to the present invention.

With reference to the drawings, hereinafter, detailed description will be given of preferred embodiments of the present invention. In the drawings, identical or corresponding portions are denoted by identical reference characters; therefore, repetitive description thereof will not be given.

FIG. 1 is a schematic block diagram showing a motor drive device equipped with a semiconductor module according to the present invention.

With reference to FIG. 1, motor drive device 100 includes a battery B, capacitors C1 and C2, a voltage step-up converter 12, inverters 14 and 31, and a control device 30.

Motor-generators MG1 and MG2 are a three-phase AC rotating electric machine, respectively. Each of motor-generators MG1 and MG2 can function as a generator and an electric motor. Herein, motor-generator MG1 mainly acts as a generator, and motor-generator MG2 mainly acts as an electric motor.

Voltage step-up converter 12 includes a reactor L1, switching elements Q1 and Q2, and diodes D1 and D2. Reactor L1 has a first end connected to a power supply line LN1 of battery B and a second end connected to an intermediate point between switching element Q1 and switching element Q2, that is, connected between an emitter of switching element Q1 and a collector of switching element Q2. Switching elements Q1 and Q2 are connected in series between power supply line LN1 and a ground line LN2. Switching element Q1 has a collector connected to power supply line LN1, and switching element Q2 has an emitter connected to ground line LN2. Moreover, diode D1 is connected between the collector and the emitter of switching element Q1 and diode D2 is connected between the collector and the emitter of switching element Q2 such that a current flows from each emitter toward each collector.

Inverter 14 includes a U-phase arm 15, a V-phase arm 16 and a W-phase arm 17. U-phase arm 15, V-phase arm 16 and W-phase arm 17 are connected in parallel between power supply line LN1 and ground line LN2.

U-phase arm 15 includes switching elements Q3 and Q4 connected in series, V-phase arm 16 includes switching elements Q5 and Q6 connected in series, and W-phase arm 17 includes switching elements Q7 and Q8 connected in series. A diode D3 is connected between a collector and an emitter of switching element Q3, a diode D4 is connected between a collector and an emitter of switching element Q4, a diode D5 is connected between a collector and an emitter of switching element Q5, a diode D6 is connected between a collector and an emitter of switching element Q6, a diode D7 is connected between a collector and an emitter of switching element Q7 and a diode D8 is connected between a collector and an emitter of switching element Q8 such that a current flows from each emitter toward each collector.

An intermediate point of U-phase arm 15 is connected to a U-phase end of a U-phase coil in motor-generator MG1, an intermediate point of V-phase arm 16 is connected to a V-phase end of a V-phase coil in motor-generator MG1, and an intermediate point of W-phase arm 17 is connected to a W-phase end of a W-phase coil in motor-generator MG1. That is, in motor-generator MG1, first ends of the U-, V- and W-phase coils are commonly connected to a neutral point. On the other hand, in motor-generator MG1, a second end of the U-phase coil is connected to an intermediate point between switching elements Q3 and Q4, a second end of the V-phase coil is connected to an intermediate point between switching elements Q5 and Q6, and a second end of the W-phase coil is connected to an intermediate point between switching elements Q7 and Q8.

Inverter 31 is similar in configuration to inverter 14. Herein, a MOS transistor is used as switching elements Q1 to Q8 in voltage step-up converter 12, inverter 14 and inverter 31, for example.

Battery B is a high-voltage battery having a structure that a large number of secondary battery cells, such as nickel-metal hydride batteries or lithium ion batteries, are connected in series. In addition to such a secondary battery, battery B may be a capacitor or a fuel battery.

Capacitor C1 smoothes a DC voltage supplied from battery B, and supplies the smoothed DC voltage to voltage step-up converter 12.

Voltage step-up converter 12 steps up the DC voltage supplied from capacitor C1, and supplies the resultant voltage to capacitor C2. Upon reception of a signal PWMC from control device 30, more specifically, voltage step-up converter 12 steps up the DC voltage in accordance with a period that switching element Q2 is turned on by signal PWMC, and supplies the resultant voltage to capacitor C2.

Upon reception of signal PWMC from control device 30, moreover, voltage step-up converter 12 steps down a DC voltage(s) supplied from inverter 14 and/or inverter 31 through capacitor C2 to charge battery B.

Capacitor C2 smoothes the DC voltage supplied from voltage step-up converter 12, and supplies the smoothed DC voltage to inverters 14 and 31.

Upon reception of a DC voltage from battery B through capacitor C2, inverter 14 converts the DC voltage to an AC voltage on the basis of a signal PWMI1 from control device 30 to drive motor-generator MG1. Thus, motor-generator MG1 is driven to produce a torque in accordance with a torque command value TR1.

At the time of regenerative braking of the hybrid vehicle equipped with motor drive device 100, moreover, inverter 14 converts an AC voltage, which is generated by motor-generator MG1, to a DC voltage on the basis of signal PWMI1 from control device 30, and supplies the converted DC voltage to voltage step-up converter 12 through capacitor C2. Examples of the regenerative braking mentioned herein include: braking that involves regeneration in such a manner that a driver of a hybrid vehicle presses a foot brake; and deceleration (or stop of acceleration) that involves regeneration in such a manner that the driver does not press the foot brake, but turns off an accelerator pedal when the vehicle runs.

Upon reception of a DC voltage from battery B through capacitor C2, inverter 31 converts the DC voltage to an AC voltage on the basis of a signal PWMI2 from control device 30 to drive motor-generator MG2. Thus, motor-generator MG2 is driven so as to generate a torque in accordance with a torque command value TR2.

At the time of regenerative braking of the hybrid vehicle equipped with motor drive device 100, moreover, inverter 31 converts an AC voltage, which is generated by motor-generator MG2, to a DC voltage on the basis of signal PWMI2 from control device 30, and supplies the converted DC voltage to voltage step-up converter 12 through capacitor C2.

In the configuration described above, inverter 14, inverter 31 and voltage step-up converter 12 integrally form a "semiconductor module" according to the present invention. Herein, reactor L1 and smoothing capacitor C2 in voltage step-up converter 12 are relatively large in size and, therefore, are disposed outside the semiconductor module separately.

Figure 2:
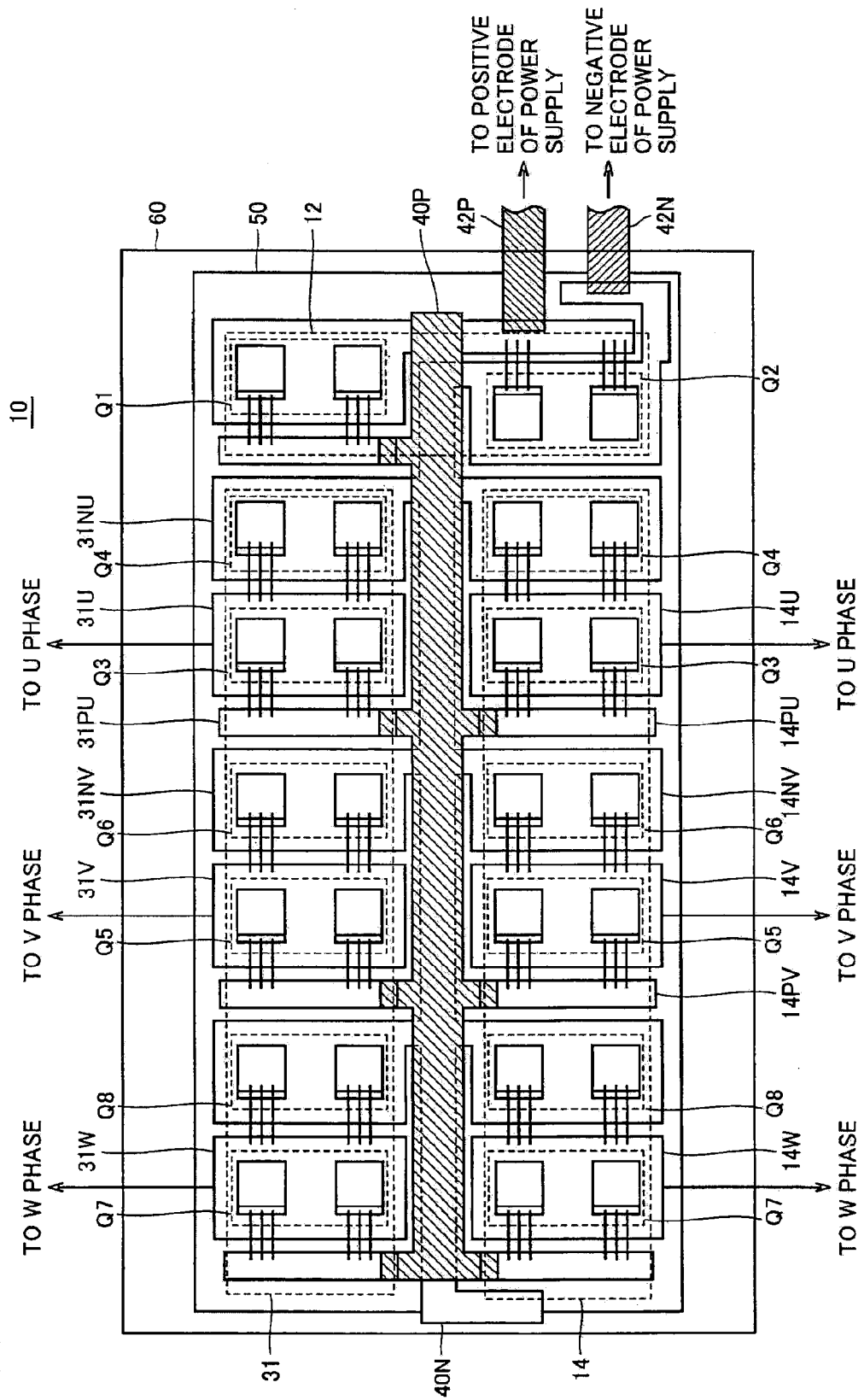
FIG. 2 is a plan view showing a general configuration of the semiconductor module according to the present invention.

With reference to FIG. 2, next, description will be given of a specific configuration example of the semiconductor module according to the present invention.

FIG. 2 is a plan view showing a general configuration of the semiconductor module according to the present invention. In the following description, for the sake of convenience, an up-to-down direction in FIG. 2 is defined as a longitudinal direction and a left-to-right direction in FIG. 2 is defined as a lateral direction.

With reference to FIG. 2, semiconductor module 10 includes bus bars 40P, 40N, 42P and 42N each extending in the lateral direction on insulating substrate 50, and switching elements Q1 to Q8 disposed above and below bus bars 40P and 40N with bus bars 40P and 40N being interposed therebetween.

Insulating substrate 50 is made of polyimide, for example. It is to be noted that insulating substrate 50 made of polyimide enhances durability to a stress generated by the substrate due to thermal expansion, in comparison with an instance where insulating substrate 50 is made of aluminum nitride. This is advantageous in a scale-up.

Further, a heat radiation plate 60 is attached to a bottom side of insulating substrate 50. As will be described later, heat radiation plate 60 cools semiconductor module 10.

Bus bar 40P forms power supply line LN1 connecting between voltage step-up converter 12 and each of inverters 14 and 31 in FIG. 1, and bus bar 40N forms ground line LN2 connecting between voltage step-up converter 12 and each of inverters 14 and 31 in FIG. 1. As will be described later, bus bar 40P and bus bar 40N are laminated in a normal direction (corresponding to a vertical direction in the figure) of insulating substrate 50 with an insulating member (not shown) being interposed therebetween.

Further, bus bar 40P is connected to bus bar 42P through switching element Q1, and bus bar 40N is connected to bus bar 42N through switching element Q2. Bus bars 42P and 42N are connected to positive and negative electrodes (not shown) of battery B, respectively. That is, bus bar 40P and bus bar 42P integrally form power supply line LN1 shown in FIG. 1, and bus bar 40N and bus bar 42N integrally form ground line LN2 shown in FIG. 1.

Switching elements Q3 to Q8 disposed above bus bars 40P and 40N form inverter 31 shown in FIG. 1. On the other hand, switching elements Q3 to Q8 disposed below bus bars 40P and 40N form inverter 14 shown in FIG. 1. Moreover, switching elements Q1 and Q2 disposed above and below bus bars 40P and 40N form voltage step-up converter 12 shown in FIG. 1.

In the example shown in FIG. 2, U-phase arms 15 (switching elements Q3 and Q4) of inverters 14 and 31, V-phase arms 16 (switching elements Q5 and Q6) of inverters 14 and 31, and W-phase arms 17 (switching elements Q7 and Q8) of inverters 14 and 31 are arranged sequentially from right to left in the figure. Herein, each of switching elements Q3 to Q8 is formed by two switching elements connected in parallel, in order to prevent each switching element from receiving an excessive load due to an increase of a passing current.

In the U-, V- and W-phase arms of inverters 14 and 31, the two switching elements connected in series between bus bar 40P and bus bar 40N are formed in such a manner that an electrode layer formed as a pattern on insulating substrate 50 is connected to each switching element through a wire.

Figure 3:
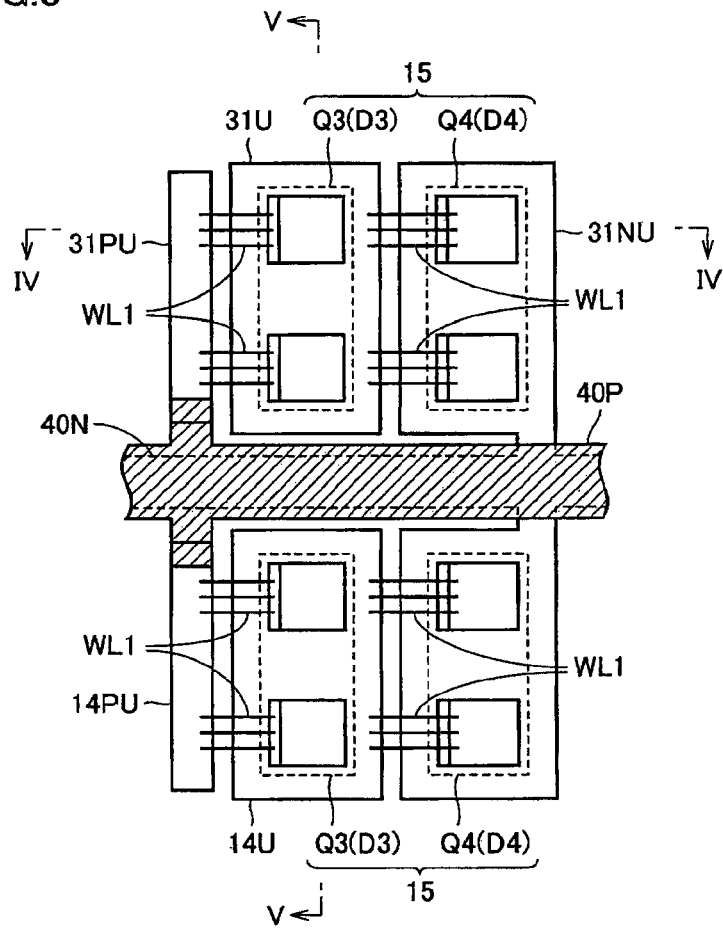
FIG. 3 is a plan view showing a specific configuration of a three-phase arm of an inverter.

FIG. 3 is a plan view showing specific configurations of three-phase arms 15 to 17 of inverters 14 and 31. It is to be noted that three-phase arms 15 to 17 are identical in configuration to one another; therefore, FIG. 3 representatively illustrates the configurations of U-phase arms 15 of inverters 14 and 31.

Figure 4:
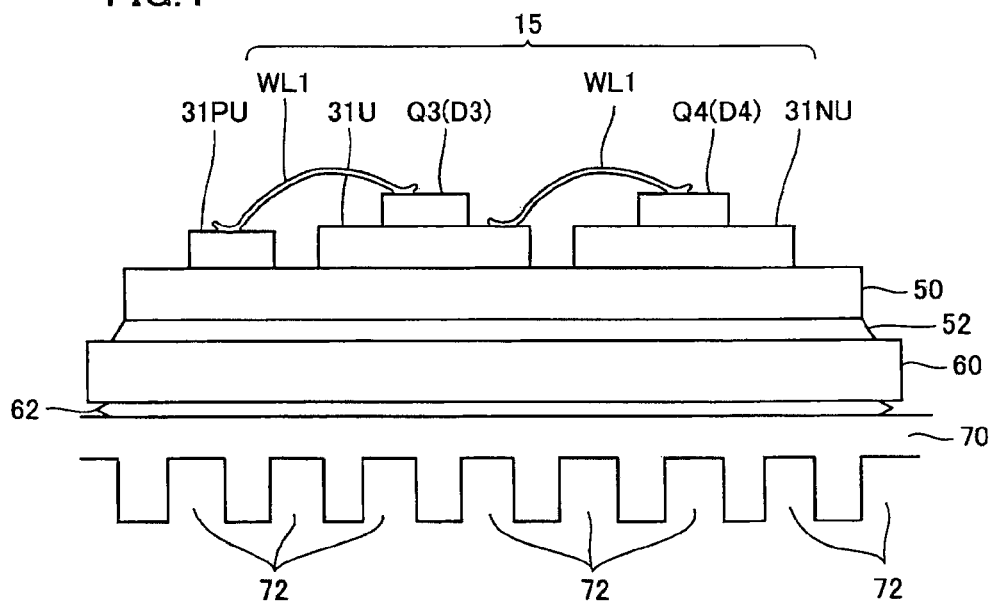
FIG. 4 is a sectional view taken along line IV-IV in FIG. 3.

FIG. 4 is a sectional view taken along line IV-IV in FIG. 3.

With reference to FIGS. 3 and 4, U-phase arm 15 of inverter 31 is disposed above bus bars 40P and 40N, and includes switching elements Q3 and Q4, a P-side electrode layer 31PU, an intermediate electrode layer 31U, and an N-side electrode layer 31NU.

Each of P-side electrode layer 31PU, intermediate electrode layer 31U and N-side electrode layer 31NU is formed as a pattern on insulating substrate 50. P-side electrode layer 31PU has a first end coupled to bus bar 40P forming power supply line LN1. N-side electrode layer 31NU has a first end coupled to bus bar 40N forming ground line LN2. Intermediate electrode layer 31U corresponds to the intermediate point of U-phase arm 15 shown in FIG. 1, and is connected to a U-phase coil end in motor-generator MG2 through a bus bar (not shown).

Switching element Q3 has a collector fastened to intermediate electrode layer 31U so as to establish electrical conduction with intermediate electrode layer 31U. Switching element Q3 also has an emitter connected to P-side electrode layer 31PU by a wire WL1.

Switching element Q4 has a collector fastened to N-side electrode layer 31NU so as to establish electrical conduction with N-side electrode layer 31NU. Switching element Q4 also has an emitter connected to intermediate electrode layer 31U by a wire WL1.

It is assumed herein that a MOS transistor is used as switching elements Q3 and Q4. Switching elements Q3 and Q4 also have rectifying properties for diodes D3 and D4 and, therefore, are integrated with diodes D3 and D4, respectively.

Insulating substrate 50 is fastened to heat radiation plate 60 such that the bottom side thereof is adhered to heat radiation plate 60 by a solder 52. Heat radiation plate 60 is disposed on a heat sink 70 through a silicon grease 62.

Heat sink 70 has a plurality of trenches 72. It is assumed herein that a water cooling system is adopted as a cooling system for inverters 14 and 31. A radiator (not shown) is provided outside semiconductor module 10 to supply cooling water. The cooling water flows through the plurality of trenches 72 of heat sink 70 in a direction perpendicular to the figure to cool switching elements Q3 and Q4 through heat radiation plate 60 and insulating substrate 50.

Figure 5:
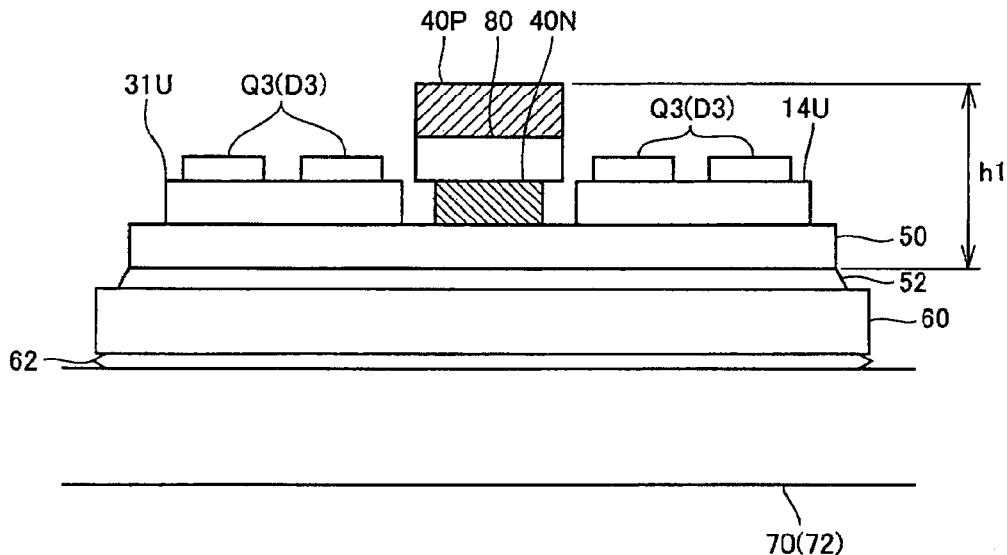
FIG. 5 is a sectional view taken along line V-V in FIG. 3.

FIG. 5 is a sectional view taken along line V-V shown in FIG. 3.

With reference to FIG. 5, intermediate electrode layer 31U in U-phase arm 15 of inverter 31 and intermediate electrode layer 14U in U-phase arm 15 of inverter 14 are arranged in a longitudinal direction (corresponding to a left-to-right direction in the figure) of insulating substrate 50. Switching elements Q3 are fastened to each of intermediate electrode layer 31U and intermediate electrode layer 14U.

Then, bus bars 40P and 40N are disposed between intermediate electrode layer 31U and intermediate electrode layer 14U. Bus bar 40P and bus bar 40N are laminated in the normal direction of insulating substrate 50 through an insulating member 80.

Of bus bars 40P and 40N forming a lamination structure, herein, upper bus bar 40P is a metal member, for example, is made of copper or the like. Of bus bars 40P and 40N, in contrast, lower bus bar 40 is a wiring layer formed on insulating substrate 50.

As described above, the semiconductor module according to the present invention has a characteristic configuration that one of bus bars 40P and 40N forming power supply line LN1 and ground line LN2, respectively, is a wiring layer.

With this configuration, the semiconductor module according to the present invention brings the following advantages, unlike a conventional semiconductor module including bus bars 40P and 40N each of which is a metal member.

Specifically, each of bus bars 40P and 40N acts as a medium for power transmission/reception carried out between battery B and each of motor-generators MG1 and MG2. Therefore, a current flows through each of bus bars 40P and 40N in the direction perpendicular to the figure. Herein, bus bars 40P and 40N generate heat in proportion to the passing current and the internal resistance. In order to prevent bus bars 40P and 40N from being overheated due to an increase of a passing current, the conventional semiconductor module has attempted to reduce internal resistance in such a manner that a metal member having a large sectional area is provided as each bus bar. Consequently, the semiconductor module increases in size in a normal direction by a length corresponding to the two metal members, which hinders miniaturization of the semiconductor module in the normal direction.

In semiconductor module 10 according to the present invention, on the other hand, bus bar 40N is provided as a wiring layer and is fastened to insulating substrate 50. This configuration realizes miniaturization of semiconductor module 10 in the normal direction while ensuring radiation of heat from bus bar 40N.

That is, bus bar 40N provided as a wiring layer brings an advantage that heat generated at bus bar 40N is cooled by the cooling water through insulating substrate 50, heat radiation plate 60 and the plurality of trenches 72 formed on heat sink 70. This configuration ensures the heat radiation property of bus bar 40N, so that bus bar 40N can be formed by a wiring layer having a relatively small sectional area. As a result, the length of semiconductor module 10 in the normal direction (corresponding to "h1" in the figure) can be made short considerably.

As described above, the semiconductor module according to the present invention achieves miniaturization in the normal direction by virtue of a wiring layer provided as the bus bar. As will be described later, further, the semiconductor module according to the present invention has a feature in an arrangement of signal lines through which switching elements Q1 and Q2 and gates of switching elements Q3 to Q8 receive signal PWMC or PWMI from control device 30.

Figure 6:
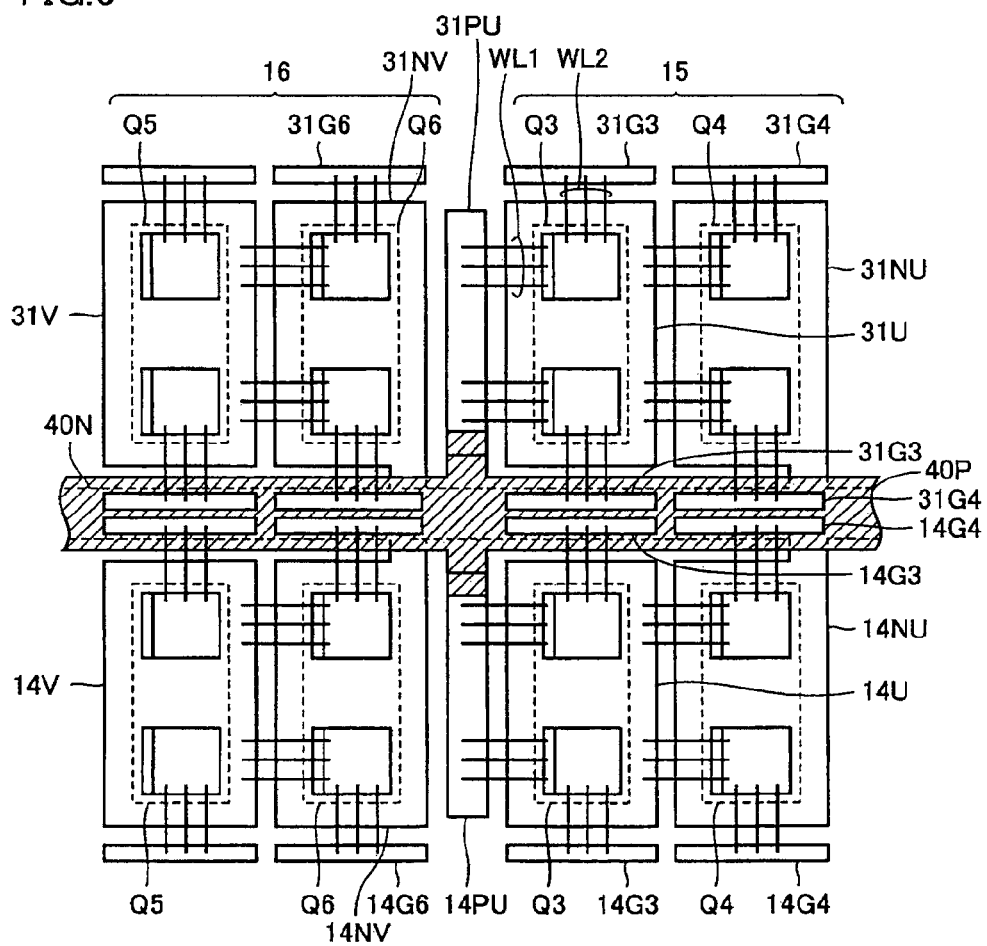
FIG. 6 is a plan view showing configurations of main components in the semiconductor module according to the present invention.

FIG. 6 is a plan view showing configurations of main components in the semiconductor module according to the present invention. In FIG. 6, signal line layers 14G3, 14G4, 31G3 and 31G4 for input of signal PWMI to the gates of switching elements Q3 and Q4 are added to the configurations of U-phase arms 15 of inverters 14 and 31 shown in FIG. 3.

With reference to FIG. 6, more specifically, signal line layers 31G3 corresponding to switching elements Q3 in U-phase arm 15 of inverter 31 are disposed above and below intermediate electrode layer 31U, respectively. Herein, signal line layer 31G3 disposed below intermediate electrode layer 31U is positioned above bus bar 40P in the normal direction of semiconductor module 10. Signal line layer 31G3 is connected to the gate of switching element Q3 by a wire WL2.

Likewise, signal line layers 31G4 corresponding to switching elements Q4 in U-phase arm 15 of inverter 31 are disposed above and below N-side electrode layer 31NU. Herein, signal line layer 31G4 disposed below N-side electrode layer 31NU is positioned above bus bar 40P in the normal direction of semiconductor module 10. Signal line layer 31G4 is connected to the gate of switching element Q4 by a wire WL2.

Signal line layers 14G3 and 14G4 corresponding to U-phase arm 15 of inverter 14 are similar in configurations to signal line layers 31G3 and 31G4. Then, signal line layers 14G3, 14G4, 31G3 and 31G4 are disposed above in the normal direction of semiconductor module 10, and are connected to a control board (not shown) equipped with control device 30. U-, V- and W-phase arms 15, 16 and 17 are arranged in the lateral direction of semiconductor module 10 with U-phase arm 15 being defined as a basic unit.

The signal line layers corresponding to the U-, V- and W-phase arms are arranged as shown in FIG. 6 to form a current path that passes P-side electrode layer 31PU, switching element Q3, intermediate electrode layer 31U, switching element Q4 and N-side electrode layer 31NU in the lateral direction of semiconductor module 10. Then, a path for input of control signal PWMI2 is formed in the longitudinal direction of semiconductor module 10, that is, in the direction substantially perpendicular to the current path.

This structure brings the following advantages with respect to an arrangement structure (FIG. 7) that the control signal input path and the current path are formed in a single direction.

Figure 7:
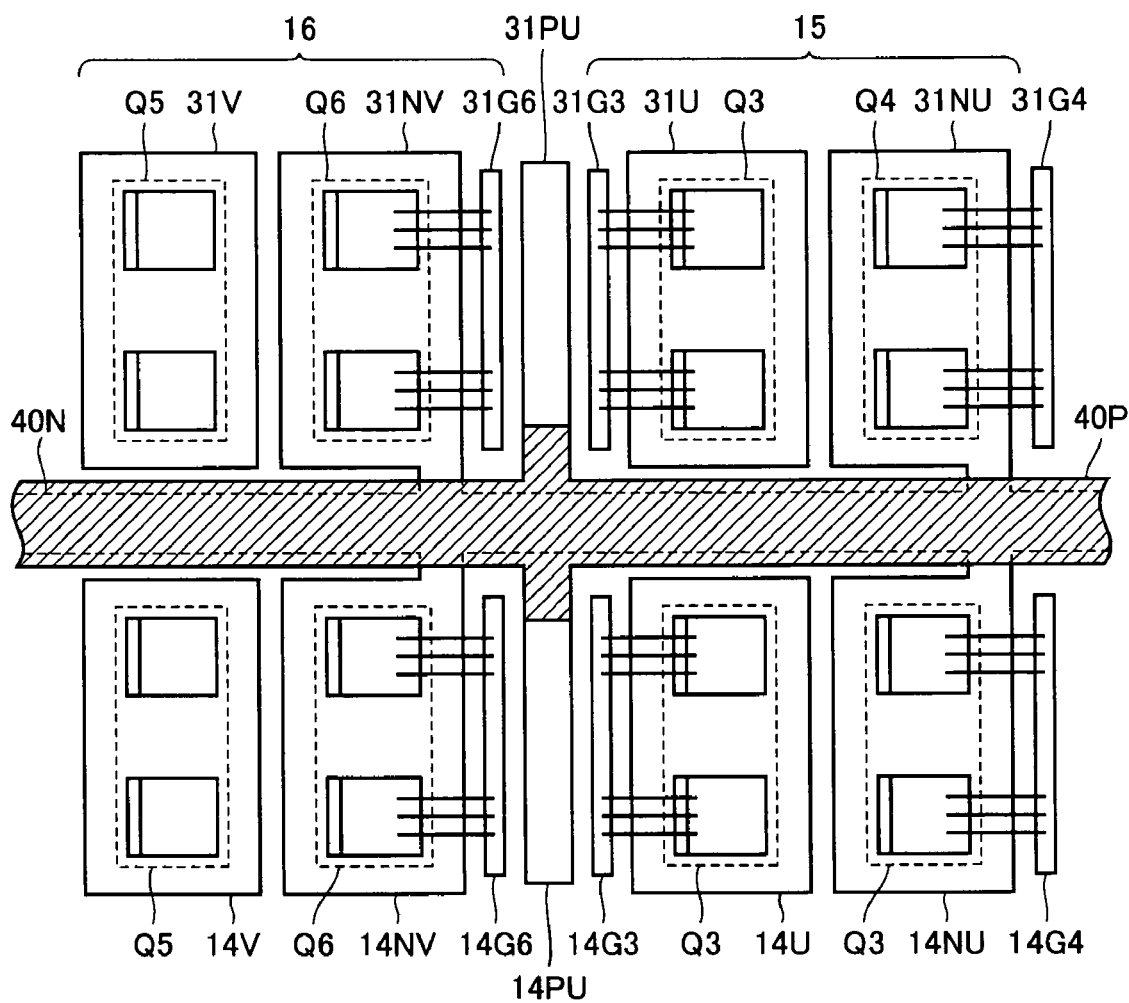
FIG. 7 is a plan view showing another configurations of the main components in the semiconductor module.

As shown in FIG. 7, more specifically, it is assumed that the signal line layers corresponding to U-phase arm 15, V-phase arm 16 and W-phase arm 17 are arranged in the lateral direction of the semiconductor module, as in an instance of other electrode layers.

With reference to FIG. 7, U-phase arm 15, V-phase arm 16 and W-phase arm 17 are arranged in the lateral direction of the semiconductor module, with U-phase arm 15 being defined as a basic unit. At a boundary between U-phase arm 15 and V-phase arm 16, therefore, signal line layer 31G6 corresponding to V-phase arm 16 of inverter 31 is arranged between P-side electrode layer 31PU of U-phase arm 15 and N-side electrode layer 31NV of V-phase arm 16. Moreover, signal line layer 14G6 corresponding to V-phase arm 16 of inverter 14 is arranged between P-side electrode layer 14PU of U-phase arm 15 and N-side electrode layer 14NV of V-phase arm 16.

That is, P-side electrode layer 31PU (or 14PU) of U-phase arm 15 and N-side electrode layer 31NV (or 14NV) of V-phase arm 16 are arranged with an interval being set therebetween. This interval corresponds to a length of signal line layer 31G6 (or 14G6) in the lateral direction.

In the arrangement structure shown in FIG. 6, on the other hand, P-side electrode layer 31PU (or 14PU) of U-phase arm 15 and N-side electrode layer 31NV (or 14NV) of V-phase arm 16 can be arranged so as to adjoin to each other without signal line layer 31G6 (or 14G6) being interposed therebetween.

As described above, a P-side electrode layer of one arm and an N-side electrode layer of another arm adjacent to the arm are arranged so as to adjoin to each other. This configuration brings an advantage that semiconductor module 10 according to the present invention can reduce an inductance to be distributed to each electrode layer.

With respect to a flowing direction of a current, for example, P-side electrode layer 31PU and N-side electrode layer 31NV adjacent to P-side electrode layer 31PU are opposite to each other. In this embodiment, a current flows from bus bar 40P to P-side electrode layer 31PU while a current flows from N-side electrode layer 31NV to bus bar 40N. Thus, a rotating direction of a magnetic field generated around P-side electrode layer 31PU by the current is opposite to a rotating direction of a magnetic field generated around N-side electrode layer 31NV by the current. This configuration allows reduction of an inductance of P-side electrode layer 31PU and an inductance of N-side electrode layer 31NV, resulting in a drop of a flyback voltage caused by the inductance in a switching operation. The decrease of the flyback current achieves a high-speed switching operation. Further, each of inverters 14 and 31, that has been formed by a switching element with a high withstand voltage so as to absorb a flyback voltage, can be formed by a small-sized switching element with a lower withstand voltage. Accordingly, this configuration allows further miniaturization and cost reduction concerning semiconductor module 10.

In the foregoing embodiment, the respective arms of voltage step-up converter 12, inverter 14 and inverter 31 are packaged as one semiconductor module; however, the configuration of the semiconductor module is not limited thereto. For example, upper and lower arms of a single phase or the entire inverter and the entire voltage step-up converter may be packaged as one semiconductor module.

(Application Example of the Semiconductor Module According to the Present Invention)

As an application example of the semiconductor module according to the present invention, finally, description will be given of a hybrid vehicle drive device in which a motor drive device including the semiconductor module and a motor are housed in one case.

Frequently, a current drive device for a hybrid vehicle adopts a simple configuration that a large box-shaped case forming an inverter is placed on a motor case. As will be described later, on the other hand, the drive device for a hybrid vehicle according to the present invention improves a position of a center of gravity of the vehicle in a height direction in an instance where the drive device is installed on the vehicle, and saves an installation space.

Figure 8:
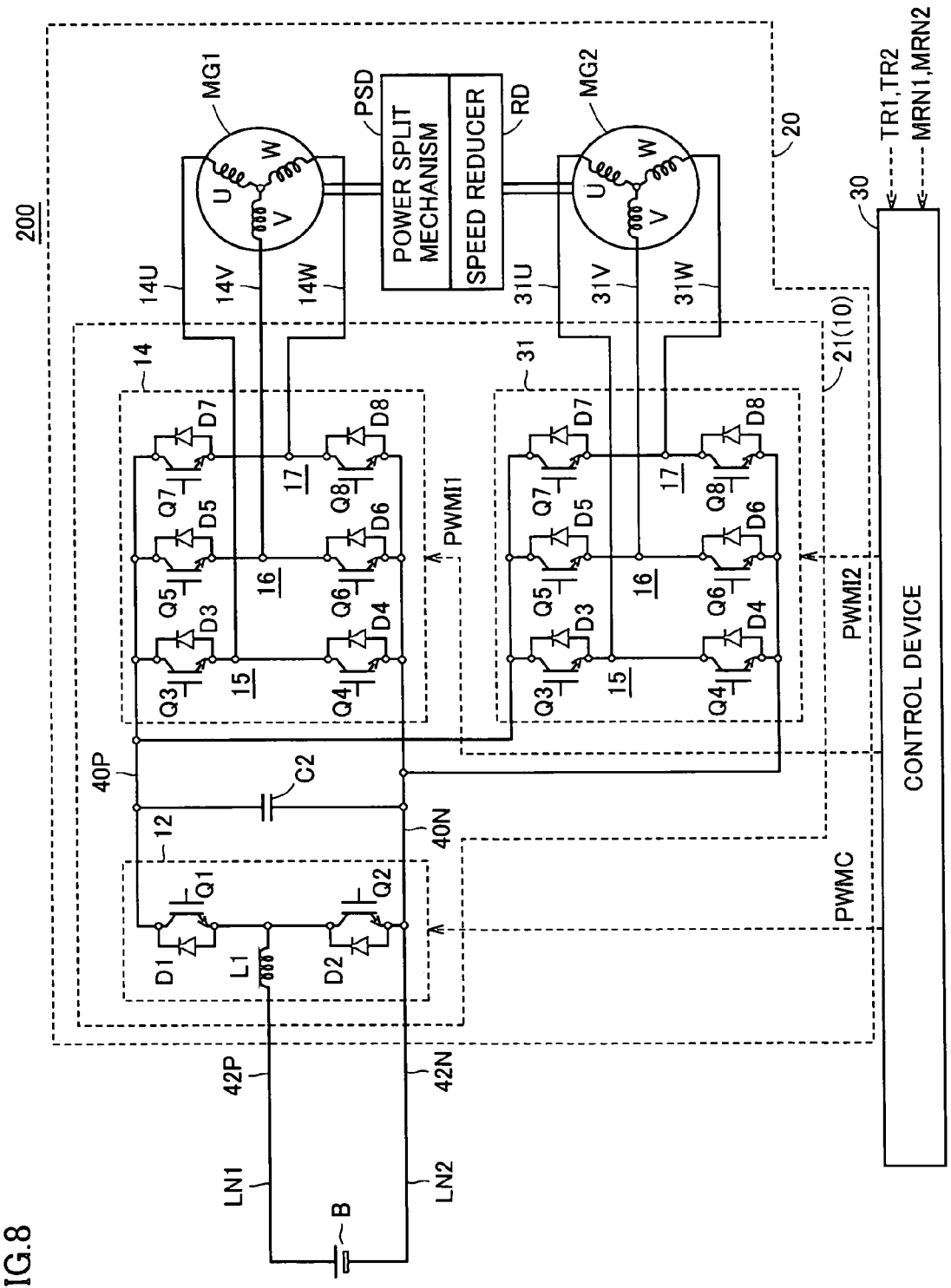
FIG. 8 is a circuit diagram showing a configuration concerning motor-generator control in a hybrid vehicle according to the present invention.

FIG. 8 is a circuit diagram showing a configuration concerning motor-generator control in a hybrid vehicle 200 according to the present invention. In hybrid vehicle 200 shown in FIG. 8, motor drive device 100 shown in FIG. 1, a power split mechanism PSD and a speed reducer RD newly form a drive device 20.

With reference to FIG. 8, vehicle 200 includes battery B, drive device 20, control device 30, an engine (not shown) and wheels (not shown).

Drive device 20 includes motor-generators MG1 and MG2, power split mechanism PSD, speed reducer RD, and a power control unit 21 for controlling motor-generators MG1 and MG2.

Basically, power split mechanism PSD distributes mechanical power to the engine, motor-generator MG1 and motor-generator MG2 each coupled thereto. Power split mechanism PSD may be, for example, a planetary gear mechanism having three rotation shafts, that is, a sun gear, a planetary carrier and a ring gear.

Power split mechanism PSD has three rotation shafts, more specifically, a rotation shaft connected to a rotation shaft of the engine, a rotation shaft connected to a rotation shaft of motor-generator MG1, and a rotation shaft connected to speed reducer RD. Speed reducer RD integrated with power split mechanism PSD reduces a torque of motor-generator MG2, and transfers the reduced torque to power split mechanism PSD.

As will be described later, the speed reducer has a rotation shaft coupled to the wheel by a decelerating gear or a differential gear (not shown).

Power control unit 21 includes inverters 14 and 31 provided in correspondence with motor-generators MG1 and MG2, respectively, and voltage step-up converter 12 provided in common for inverters 14 and 31.

In power control unit 21, three-phase arms 15 to 17 of inverter 14, three-phase arms 15 to 17 of inverter 31, and arm portions of voltage step-up converter 12 are integrated with one another to form a semiconductor module 10. Semiconductor module 10 is identical in configuration to semiconductor module 10 mounted to motor drive device 100 shown in FIG. 1; therefore, detailed description thereof will not be given here.

Figure 9:
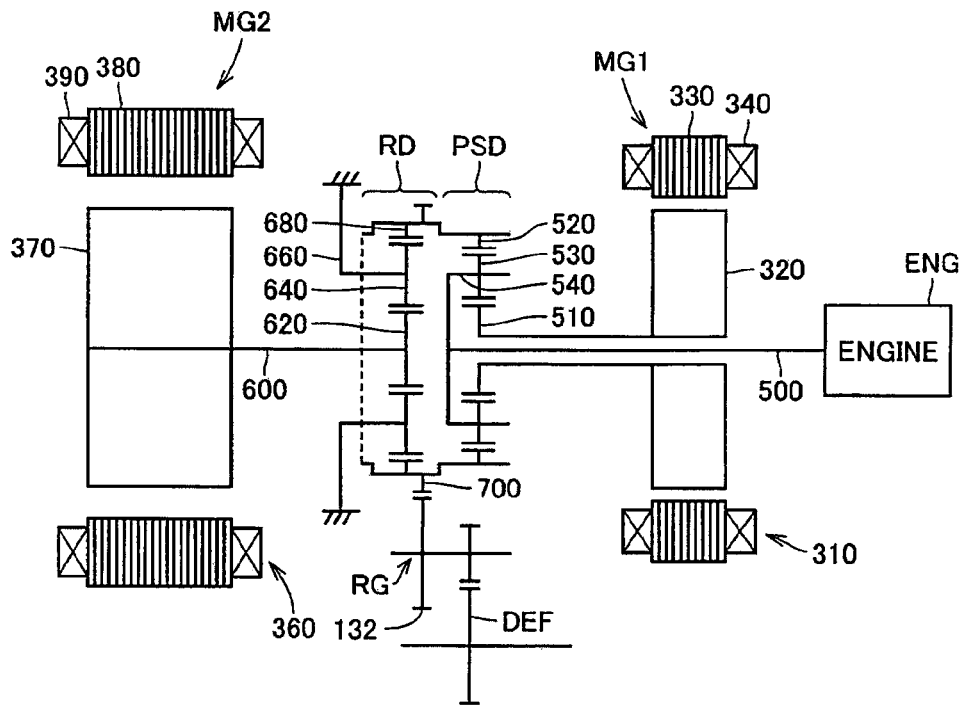
FIG. 9 is a schematic diagram illustrating details of a power split mechanism and a speed reducer each shown in FIG. 8.

FIG. 9 is a schematic diagram illustrating details of power split mechanism PSD and speed reducer RD each shown in FIG. 8.

With reference to FIG. 9, the vehicle drive device includes motor-generator MG2, speed reducer RD connected to the rotation shaft of motor-generator MG2, an axle rotating in accordance with a torque of the rotation shaft reduced by speed reducer RD, engine ENG, motor-generator MG1, and power split mechanism PSD distributing mechanical power to speed reducer RD, engine ENG and motor-generator MG1. In speed reducer RD, for example, a speed reduction ratio from motor-generator MG2 to power split mechanism PSD is not less than two times.

A crank shaft 500 of engine ENG, a rotor 320 of motor-generator MG1 and a rotor 370 of motor-generator MG2 rotate about a single axis.

Power split mechanism PSD is a planetary gear in the example shown in FIG. 9. Power split mechanism PSD includes a sun gear 510, a ring gear 520, a pinion gear 530 and a planetary carrier 540. Sun gear 510 is coupled to a hollow sun gear shaft having an axial center through which crank shaft 500 is inserted. Ring gear 520 is supported rotatably so as to be coaxially with crank shaft 500. Pinion gear 530 is disposed between sun gear 510 and ring gear 520, and orbits around a perimeter of sun gear 510 while rotating. Planetary carrier 540 is coupled to an end of crank shaft 500 to support a rotation shaft of pinion gear 530.

Power split mechanism PSD has, as a mechanical power transmitting/receiving shaft, three shafts, that is, the sun gear shaft coupled to sun gear 510, a ring gear case coupled to ring gear 520 and crank shaft 500 coupled to planetary carrier 540. When mechanical power to be transmitted/received from two of these three shafts is determined, mechanical power to be transmitted to/received from the remaining one shaft is determined on the basis of the former mechanical power.

A counter drive gear 700 for extraction of mechanical power is provided outside the ring gear case to rotate integrally with ring gear 520. Counter drive gear 700 is connected to a speed reduction gear RG. The mechanical power is transferred between counter drive gear 700 and speed reduction gear RG. Speed reduction gear RG drives a differential gear DEF. In a downhill slope and the like, a torque of the wheel is transferred to differential gear DEF, so that speed reduction gear RG is driven by differential gear DEF.

Motor-generator MG1 includes a stator 310 and rotor 320. Stator 310 forms a rotating magnetic field. Rotor 320 is disposed inside stator 310 and has a plurality of permanent magnets embedded therein. Stator 310 includes a stator core 330 and a three-phase coil 340 wound around stator core 330. Rotor 320 is coupled to the sun gear shaft rotating integrally with sun gear 510 of power split mechanism PSD. Stator core 330 is formed by lamination of electromagnetic thin steel plates, and is fixed to a case (not shown).

Motor-generator MG1 serves as an electric motor for rotationally driving rotor 320, by interaction between a magnetic field generated by a permanent magnet embedded in rotor 320 and a magnetic field formed by three-phase coil 340. Motor-generator MG1 also serves as a generator for generating an electromotive force at two ends of three-phase coil 340, by interaction between the magnetic field generated by the permanent magnet and a torque produced by rotor 320.

Motor-generator MG2 includes a stator 360 and rotor 370. Stator 360 forms a rotating magnetic field. Rotor 370 is disposed inside stator 360 and has a plurality of permanent magnets embedded therein. Stator 360 includes a stator core 380 and a three-phase coil 390 wound around stator core 380.

Rotor 370 is coupled to the ring gear case rotating integrally with ring gear 520 of power split mechanism PSD, through speed reducer RD. Stator core 380 is formed by lamination of electromagnetic thin steel plates, and is fixed to the case (not shown).

Motor-generator MG2 serves as a generator for generating an electromotive force at two ends of three-phase coil 390, by interaction between a magnetic field generated by a permanent magnet and a torque produced by rotor 370. Motor-generator MG2 also serves as an electric motor for rotationally driving rotor 370, by interaction between the magnetic field generated by the permanent magnet and a magnetic field formed by three-phase coil 390.

Speed reducer RD reduces a speed by a structure that a planetary carrier 660, which is one of rotating elements of a planetary gear, is fixed to the case of the vehicle drive device. That is, speed reducer RD includes a sun gear 620, a ring gear 680 and a pinion gear 640. Sun gear 620 is coupled to a shaft of rotor 370. Ring gear 680 rotates integrally with ring gear 520. Pinion gear 640 is engaged with ring gear 680 and sun gear 620 to transfer a torque of sun gear 620 to ring gear 680.

For example, teeth of ring gear 680, which are not less than two times in number larger than those of sun gear 620, make a speed reduction ratio not less than two times.

Figure 10:
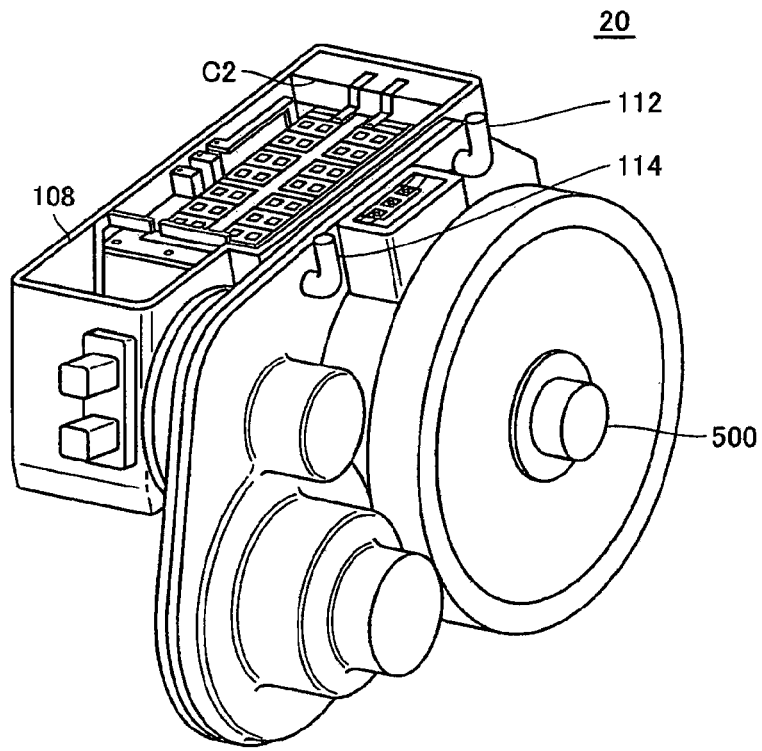
FIG. 10 is a perspective view showing an external appearance of a hybrid vehicle drive device according to the present invention.

FIG. 10 is a perspective view showing an external appearance of hybrid vehicle drive device 20 according to the present invention.

Figure 11:
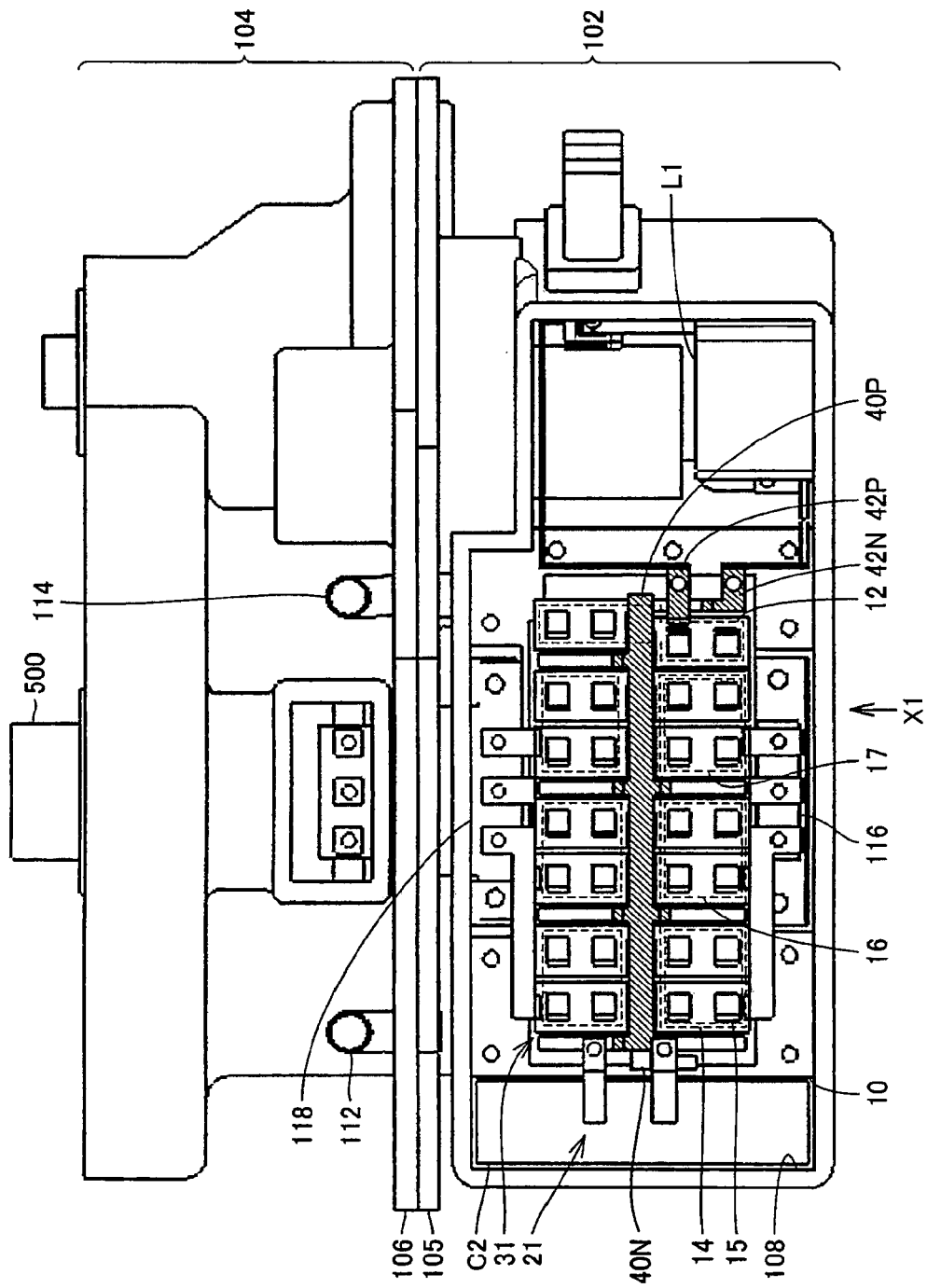
FIG. 11 is a plan view showing the hybrid vehicle drive device.

FIG. 11 is a plan view showing drive device 20.

With reference to FIGS. 10 and 11, the case of drive device 20 can be divided into a case 104 and a case 102. Case 104 corresponds to a portion for mainly housing motor-generator MG1, and case 102 corresponds to a portion for mainly housing motor-generator MG2 and power control unit 21.

Case 104 is provided with a flange 106 and case 102 is provided with a flange 105. Flange 106 and flange 105 are fixed to each other through a bolt or the like; thus, case 104 and case 102 are integrated with each other.

Case 102 is also provided with an opening 108 for assembly of power control unit 21. In opening 108, capacitor C2 is housed at a left side (a side in a vehicle traveling direction), semiconductor module 10 and terminal bases 116 and 118 are housed at a center, and reactor L1 is housed at a right side. In a state where drive device 20 is installed on the vehicle, opening 108 is closed by a lid. In opening 108, alternatively, capacitor C2 may be housed at the right side and reactor L1 may be housed at a left side of semiconductor module 10.

That is, reactor L1 is disposed at a side of one of the rotation shafts of motor-generators MG1 and MG2 while capacitor C2 is disposed at a side of the other one of the rotation shafts of motor-generators MG1 and MG2. Then, semiconductor module 10 is disposed at an area between capacitor C2 and reactor L1. Motor-generator MG2 is disposed below semiconductor module 10.

Semiconductor module 10 is similar in configuration to that described with reference to FIG. 2.

Specifically, switching elements Q1 to Q8 of inverters 14 and 31 are disposed on the top side of insulating substrate 50. Further, bus bars 40P and 40N are provided at an area between inverter 14 and inverter 31 so as to overlap with each other in the normal direction (corresponding to the vertical direction in the figure) of insulating substrate 50.

Bus bar 40P serves as an upper layer of a lamination structure and forms power supply line LN1. Herein, bus bar 40P is a metal member. On the other hand, bus bar 40N serves as a lower layer of the lamination structure and forms ground line LN2. Herein, bus bar 40N is a wiring layer.

Further, heat sink 70 (not shown) is provided on the bottom side of insulating substrate 50 through heat radiation plate 60 (not shown). Heat sink 70 is provided with the plurality of trenches 72 each forming a water channel, and case 102 has a cooling water inlet 114 and a cooling water outlet 112 each connected to the water channel. These inlet and outlet are formed in such a manner that flanges 106 and 105 are perforated with holes and, then, union nuts and the like are inserted into the holes in case 102.

Herein, the water channel may be formed in such a manner that the cooling water directly flows on the bottom side of heat radiation plate 60 through no heat sink 70. This configuration allows further reduction of the length of semiconductor module 10 in the normal direction.

In inverter 14, further, U-phase arm 15, V-phase arm 16 and W-phase arm 17 are provided with bus bars, respectively, which are oriented to terminal base 116 connected to the stator coil of motor-generator MG2. In inverter 31, likewise, U-phase arm 15, V-phase arm 16 and W-phase arm 17 are provided with bus bars, respectively, which are oriented to terminal base 118 connected to the stator coil of motor-generator MG1.

Figure 12:
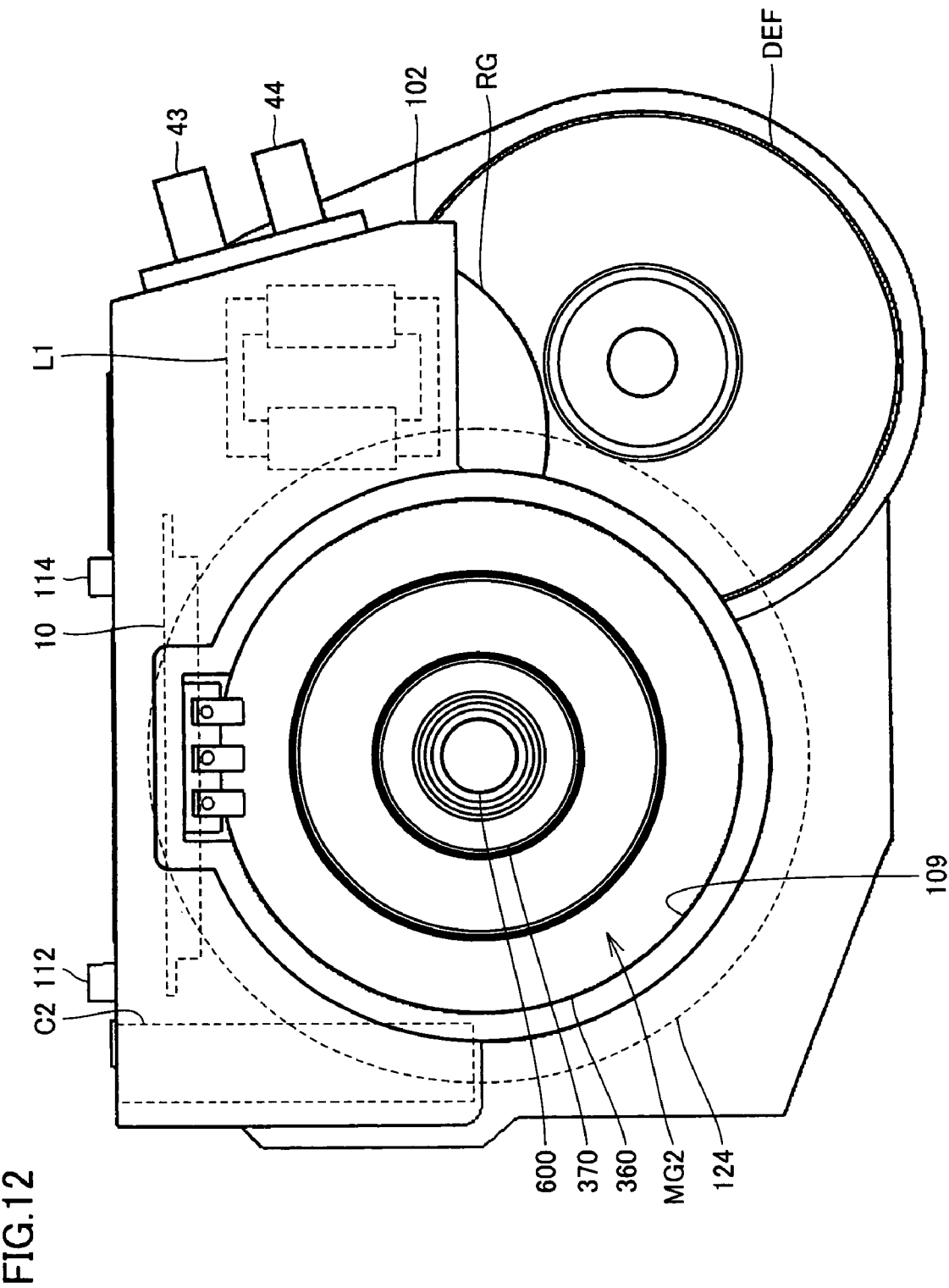
FIG. 12 is a side view showing the hybrid vehicle drive device when being seen in an X1 direction shown in FIG. 11.

FIG. 12 is a side view showing drive device 20 when being seen in an X1 direction shown in FIG. 11.

With reference to FIG. 12, case 102 is provided with an opening 109 for assembly of a motor-generator and for maintenance. Opening 109 is closed by a lid in a state where drive device 20 is installed on the vehicle.

Motor-generator MG2 is disposed in opening 109. Rotor 370 is disposed in stator 360 to which the U-, V- and W-phase bus bars are connected. Hollow shaft 600 is seen from the center of rotor 370.

As shown in FIG. 12, stator 360 of motor-generator MG2 is largely engaged in a chamber for housing power control unit 21 in case 102. Therefore, reactor L1 is disposed at a first side of motor-generator MG2 and capacitor C2 is disposed at a second side of motor-generator MG2. That is, large-sized components are housed efficiently. In addition, semiconductor module 10 is disposed above stator 360 of motor-generator MG2.

According to this arrangement structure, capacitor C2, semiconductor module 10 and reactor L1 forming power control unit 21 are disposed inside a horizontal dimension at the time when the vehicle drive device is installed on the vehicle. Herein, the horizontal dimension is determined on the basis of a projected portion of the case that houses a damper 124, motor-generator MG2, speed reduction gear RG and differential gear DEF. Thus, the hybrid vehicle drive device can be made compact.

In a vertical direction upon installation on the vehicle, semiconductor module 10 is disposed in such a manner that a height of a projected portion of the case that houses semiconductor module 10 does not exceed a height of a space of the case that houses damper 124, motor-generator MG2, speed reduction gear RG and differential gear DEF. This disposition is effected owing to considerable reduction of the height of semiconductor module 10 in the normal direction by formation of one of bus bars 40P and 40N for power supply as a wiring layer.

It is understood from the foregoing description that semiconductor module 10, reactor L1 and capacitor C2 forming power control unit 21 are disposed inside the vertical dimension defined by an outer rim of the case portion for housing differential gear DEF and an outer rim of the case portion for housing damper 124. This configuration makes a center of gravity of the vehicle low and improves running stability of the vehicle.

(Modification)

In the hybrid vehicle drive device described above, power control unit 21 including semiconductor module 10 adopts a typical water cooling system as a cooling system.

It is assumed herein that an element which can be actuated at high temperature, such as a SiC-MOS element, is used as the switching element. Thus, the switching element can be actuated at a temperature almost equal to a heat-resistant temperature of the motor-generator. Accordingly, the switching element can adopt, as a cooling system, an oil cooling system used in common with the motor-generator, in place of the water cooling system used for only power control unit 21. As a result, the configuration of the entire device can be made more compact. Moreover, the cooling operation can be performed without provision of a cooling water path on semiconductor module 10. This configuration makes the center of gravity of the vehicle low and improves the running stability of the vehicle.

As a modification of the hybrid vehicle drive device to which the semiconductor module according to the present invention is applied, hereinafter, description will be given of a hybrid vehicle drive device that adopts an oil cooling system as a cooling system for power control unit 21.

In this modification, heat generated at power control unit 21 including semiconductor module 10 and heat generated at motor-generators MG1 and MG2 are dissipated partially by radiation and the like, but are cooled mainly by heat exchange with a lubricant.

Accordingly, the heat generated at power control unit 21 and the heat generated at motor-generator MG1 and motor-generator MG2 are transferred to the case of motor-generator MG1 by the lubricant, and then are transferred from the case to a cylinder block of engine ENG. The cylinder block is cooled by the cooling water, so that a temperature increase is suppressed. As a result, the temperature of each of power control unit 21, motor-generator MG1 and motor-generator MG2 is also prevented from being increased.

Figure 13:
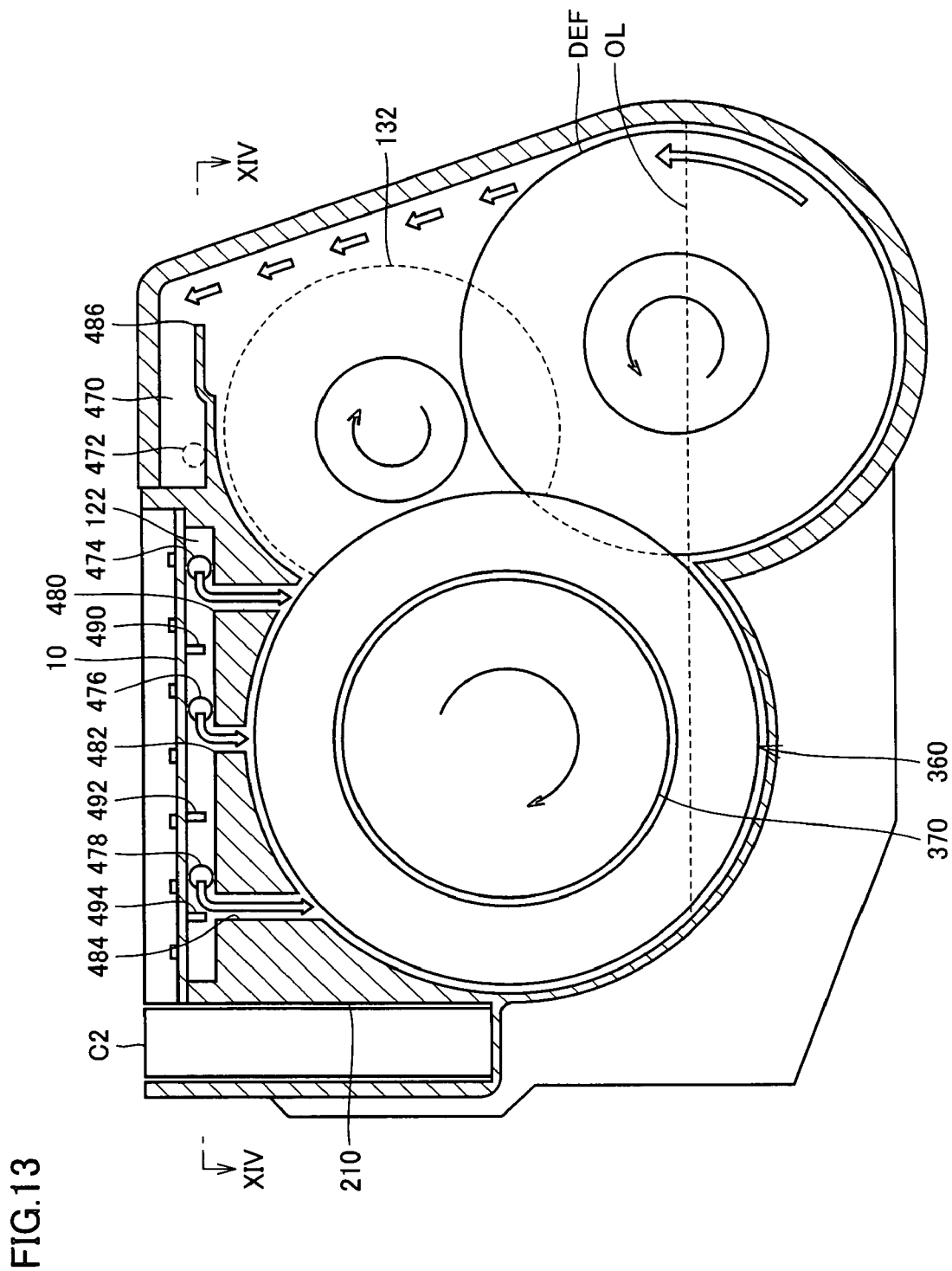
FIG. 13 is a sectional view showing an oil circulation path in the hybrid vehicle drive device.

FIG. 13 is a sectional view showing an oil circulation path in drive device 20.

With reference to FIG. 13, there are shown a section of a boundary portion between a chamber for housing motor-generator MG2 and a chamber for housing power control unit 21, and a section of a case portion for housing speed reduction gear RG and differential gear DEF.

Figure 14:
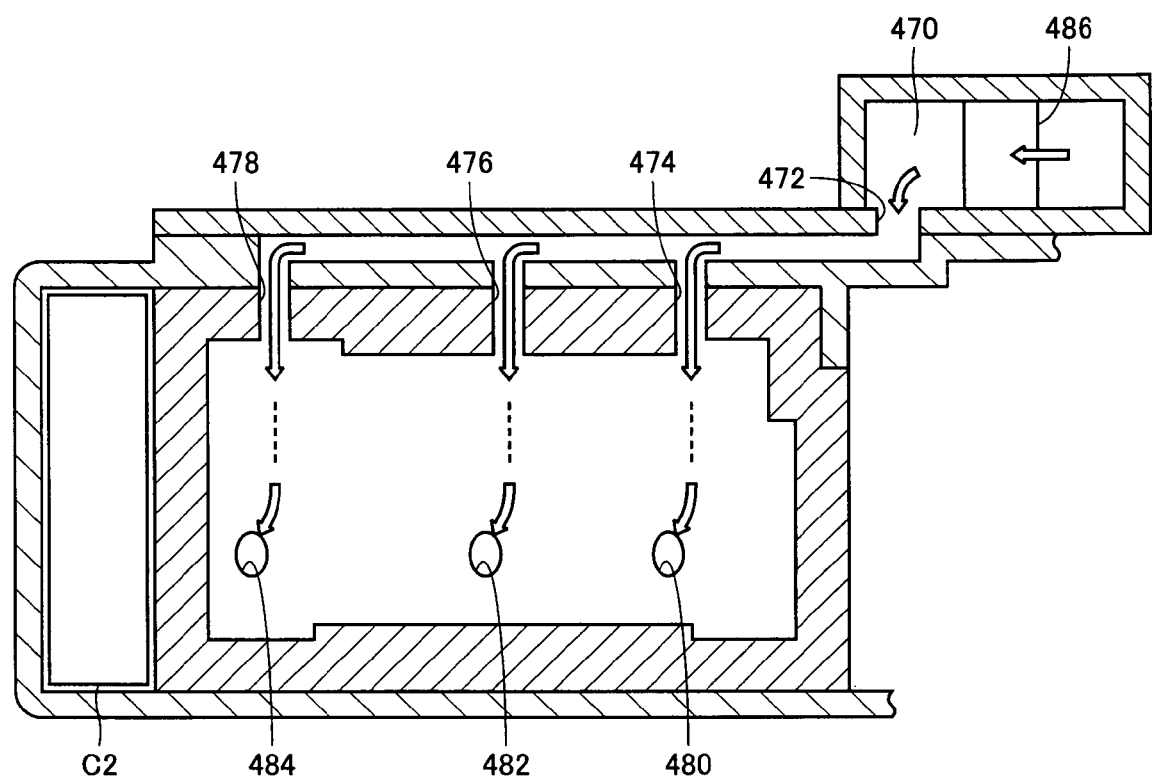
FIG. 14 is a partial sectional view taken along line XIV-XIV in FIG. 13.

FIG. 14 is a partial sectional view taken along line XIV-XIV in FIG. 13.

With reference FIGS. 13 and 14, case 102 is provided with a partition wall 210 for partitioning two spaces, that is, the chamber for housing power control unit 21 and the chamber for housing motor-generator MG2. An oil path 122 for oil that cools semiconductor module 10 is provided at a top side of partition wall 210, and is communicated with an oil reservoir 470 and the chamber for housing motor-generator MG2. In order to prevent the lubricant in motor-generator MG2 from being leaked toward semiconductor module 10, semiconductor module 10 is sealed with partition wall 210 and a liquid gasket.

The lubricant is stored in a bottom of the case up to an oil level OL. This bottom of the case corresponds to an oil pan. Herein, an oil pan may be provided separately on the bottom of the case.

Counter drive gear 700 shown in FIG. 9 is rotated in accordance with the torque of rotor 370. Then, a counter driven gear 132 is rotated by counter drive gear 700. Thus, differential gear DEF rotates in accordance with a torque of counter driven gear 132.

As shown by arrow marks in FIG. 13, then, differential gear DEF lifts the lubricant. An oil catch plate 486 is provided at an upper side of the case, and the oil lifted by differential gear DEF is stored in oil reservoir 470. Oil reservoir 470 is located at an upstream side of power control unit 21 including semiconductor module 10, at the lubricant circulation path. Oil reservoir 470 is provided with an oil outlet 472. As shown in FIG. 14, oil outlet 472 is communicated with oil inlets 474, 476 and 478 each extending to a lower space of semiconductor module 10.

At a surface opposite to a switching element mount surface in semiconductor module 10, fins 490, 492 and 494 are provided for dissipating heat with the use of the oil. The heat of the switching element is dissipated by the lubricant through these fins. Thereafter, the lubricant passes through oil outlets 480, 482 and 484 provided in partition wall 210, and then is flown into the upper portion of stator 360. The lubricant is flown along an outer circumference of stator 360, and is returned to the bottom of the case again.

As described above, semiconductor module 10 is heated by driving the motor-generator, and then is cooled with the use of the lubricant in the motor-generator. The heat of the lubricant that circulates through the motor-generator is dissipated toward the housing of the engine.

Thus, a cooling operation can be performed without provision of a cooling water path at an integrated portion of the motor and the inverter. Hence, semiconductor module 10 does not require heat sink 70 that forms a water channel in a water cooling system. As a result, this configuration allows further reduction of the length of semiconductor module 10 in the normal direction. Accordingly, this configuration makes the center of gravity of the vehicle lower, achieves space savings and improves the degree of freedom concerning design.

In the foregoing embodiment, representatively, the semiconductor module is applied to the motor drive device and the hybrid vehicle drive device; however, an applicable range of the semiconductor module according to the present invention is not limited thereto. For example, the present invention is applicable to an alternator or an ignition device adopting a power semiconductor element in a vehicle system.

It should be understood that the embodiments disclosed herein are in all aspects illustrative and not restrictive. Since the scope of the present invention is defined by the appended claims rather than by the foregoing description, and all changes that fall within metes and bounds of the claims, or equivalence of such metes and bounds thereof are intended to be embraced by the claims.

INDUSTRIAL APPLICABILITY

The present invention is applicable to a semiconductor module formed by an inverter and a converter to be mounted to a motor drive device, and a hybrid vehicle drive device including the semiconductor module.

The invention claimed is:

1. A semiconductor module comprising:
    a first power supply line connected to a first electrode of a power supply;
    a second power supply line connected to a second electrode of said power supply;
    first and second switching elements connected between said first power supply line and said second power supply line; and
    an insulating substrate having said first and second switching elements mounted thereon;
    wherein:
        said first power supply line includes a bus bar coupled to a first electrode layer of said first switching element,
        said second power supply line includes a wiring layer disposed on said insulating substrate and coupled to a second electrode layer of said second switching element, and
        said wiring layer and said bus bar are laminated in the normal direction of said insulating substrate.

2. The semiconductor module according to claim 1, further comprising:
    a signal line layer disposed on said insulating substrate to transmit a control signal to control electrodes of said first and second switching elements;
    a first conductor member bringing said first power supply line, said first and second switching elements and said second power supply line into electrical conduction; and
    a second conductor member bringing the control electrodes of said first and second switching elements and said signal line layer into electrical conduction, wherein
    said signal line layer is disposed such that an extending direction of said first conductor member is substantially perpendicular to an extending direction of said second conductor member.

3. The semiconductor module according to claim 2, wherein
    said first electrode layer and said second electrode layer are disposed such that a direction of a current passing through said first switching element is opposite to a direction of a current passing through said second switching element.

4. The semiconductor module according to claim 1, further comprising
    a heat radiation member attached to a bottom side of said insulating substrate.

5. A drive device for a hybrid vehicle, comprising:
a damper coupled with a crank shaft of an internal combustion engine;
a rotating electric machine disposed so as to have an axis of rotation aligned with an axis of rotation of said damper;
a power transfer mechanism transferring, to a driving shaft, a combination of mechanical power generated by said internal combustion engine with mechanical power generated by said rotating electric machine;
a case housing said damper, said rotating electric machine and said power transfer mechanism; and
a power control unit including a semiconductor module and controlling said rotating electric machine, wherein
said semiconductor module includes:
a first power supply line connected to a first electrode of a power supply;
a second power supply line connected to a second electrode of said power supply;
first and second switching elements connected between said first power supply line and said second power supply line; and
an insulating substrate having said first and second switching elements mounted thereon,
said first power supply line includes a bus bar coupled to a first electrode layer of said first switching element, and said second power supply line includes a wiring layer disposed on said insulating substrate and coupled to a second electrode layer of said second switching element, and
said power control unit is, when being projected in a direction of said axis of rotation, disposed in said case so as to fall within a horizontal dimension of a projected portion of said case, that houses said damper, said rotating electric machine and said power transfer mechanism, upon installation on the vehicle.

6. The drive device according to claim 5, wherein
said semiconductor module further includes:
a signal line layer disposed on said insulating substrate to transmit a control signal to control electrodes of said first and second switching elements;
a first conductor member bringing said first power supply line, said first and second switching elements and said second power supply line into electrical conduction; and
a second conductor member bringing the control electrodes of said first and second switching elements and said signal line layer into electrical conduction, and
said signal line layer is disposed such that an extending direction of said first conductor member is substantially perpendicular to an extending direction of said second conductor member.

7. The drive device according to claim 6, wherein
said first electrode layer and said second electrode layer are disposed such that a direction of a current passing through said first switching element is opposite to a direction of a current passing through said second switching element.

8. The drive device according to claim 5, wherein
said semiconductor module further includes a heat radiation member attached to a bottom side of said insulating substrate.

9. A drive device for a hybrid vehicle, comprising:
a damper coupled with a crank shaft of an internal combustion engine;
a rotating electric machine disposed so as to have an axis of rotation aligned with an axis of rotation of said damper;
a power transfer mechanism transferring, to a driving shaft, a combination of mechanical power generated by said internal combustion engine with mechanical power generated by said rotating electric machine;
a case housing said damper, said rotating electric machine and said power transfer mechanism; and
a power control unit including a semiconductor module and controlling said rotating electric machine, wherein
said semiconductor module includes:
a first power supply line connected to a first electrode of a power supply;
a second power supply line connected to a second electrode of said power supply;
first and second switching elements connected between said first power supply line and said second power supply line; and
an insulating substrate having said first and second switching elements mounted thereon,
said first power supply line includes a bus bar coupled to a first electrode layer of said first switching element, and said second power supply line includes a wiring layer disposed on said insulating substrate and coupled to a second electrode layer of said second switching element, and
said power control unit is, when being projected in a direction of said axis of rotation, disposed in said case so as to fall within a vertical dimension of a projected portion of said case, that houses said damper, said rotating electric machine and said power transfer mechanism, upon installation on the vehicle.

10. The drive device according to claim 9, wherein
said semiconductor module further includes:
a signal line layer disposed on said insulating substrate to transmit a control signal to control electrodes of said first and second switching elements;
a first conductor member bringing said first power supply line, said first and second switching elements and said second power supply line into electrical conduction; and
a second conductor member bringing the control electrodes of said first and second switching elements and said signal line layer into electrical conduction, and
said signal line layer is disposed such that an extending direction of said first conductor member is substantially perpendicular to an extending direction of said second conductor member.

11. The drive device according to claim 10, wherein
said first electrode layer and said second electrode layer are disposed such that a direction of a current passing through said first switching element is opposite to a direction of a current passing through said second switching element.

12. The drive device according to claim 9, wherein
said semiconductor module further includes a heat radiation member attached to a bottom side of said insulating substrate.

13. The drive device according to claim 5, wherein
said power control unit further includes:
a reactor disposed at a first side of said rotating electric machine with respect to an axis of rotation center; and
a capacitor disposed at a second side of said rotating electric machine with respect to said axis of rotation center.

14. The drive device according to claim 9, wherein
said power control unit further includes:
a reactor disposed at a first side of said rotating electric machine with respect to an axis of rotation center; and
a capacitor disposed at a second side of said rotating electric machine with respect to said axis of rotation center.

* * * * *